United States Patent [19]
Blomquist

[11] Patent Number: 5,671,118
[45] Date of Patent: Sep. 23, 1997

[54] HEAT SINK AND RETAINER FOR ELECTRONIC INTEGRATED CIRCUITS

[76] Inventor: Michael L. Blomquist, 451 Constitution Ave., Unit E, Camarillo, Calif. 93010

[21] Appl. No.: 693,029

[22] Filed: Aug. 6, 1996

Related U.S. Application Data

[63] Continuation of Ser. No. 441,274, May 15, 1995, Pat. No. 5,600,540.

[51] Int. Cl.$^6$ .................................................. H05K 7/20
[52] U.S. Cl. .................... 361/704; 24/458; 174/16.3; 257/727; 361/722
[58] Field of Search ........................ 361/704, 707, 361/709–712, 717–719, 687, 722; 174/16.3; 165/80.3, 185; 257/706, 707, 719, 727; 267/150, 160; 248/316.7, 505, 510; 24/295, 625, 455–458

[56] References Cited

U.S. PATENT DOCUMENTS

| | | | |
|---|---|---|---|
| 4,660,123 | 4/1987 | Hermann | 361/386 |
| 4,716,494 | 12/1987 | Bright | 361/386 |
| 4,879,891 | 11/1989 | Hinshaw | 72/254 |
| 4,884,331 | 12/1989 | Hinshaw | 29/558 |
| 5,068,764 | 11/1991 | Bland | 361/386 |
| 5,208,731 | 5/1993 | Blomquist | 361/386 |
| 5,282,111 | 1/1994 | Hopfer | 361/704 |
| 5,295,043 | 3/1994 | Beijer | 361/704 |
| 5,371,652 | 12/1994 | Clemens | 361/704 |
| 5,396,402 | 3/1995 | Perugini et al. | 361/704 |
| 5,448,449 | 9/1995 | Bright | 361/704 |
| 5,486,981 | 1/1996 | Blomquist | 361/704 |

OTHER PUBLICATIONS

Thermalloy Advertisement for Heat Sinks (Jun. 1994) pp. 1–4, 6.
Advanced Logic Research, Inc. (ALR ®) Mar. 27, 1995, p. 1.

Primary Examiner—Gerald P. Tolin
Attorney, Agent, or Firm—Paul Adams

[57] ABSTRACT

A heat sink and retainer clip for use in conjunction with an electronic integrated circuit, such as a semiconductor device, to provide cooling of the device, the device being mounted on a rectangular socket with opposing sidewalls and at least two of the sidewalls having lugs projecting laterally outward. The heat sink has a flat plate and a plurality of fins projecting upward from the top surface, except over the central portion of the plate. The retainer clip is constructed of two pieces. One piece is an elongated strap having a bent portion that bears down on the heat sink to force it into a heat conducting relationship with the device and also includes an opening that is hooked on the one of the lugs. The strap lies in the central portion of the sink. The second piece is rotatably mounted on the end of the first piece and when forced down and rotated inward, an opening will hook on the other lug.

12 Claims, 5 Drawing Sheets

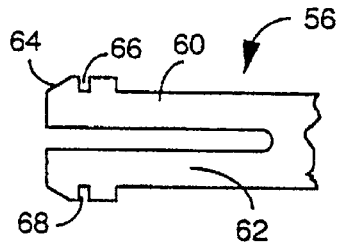
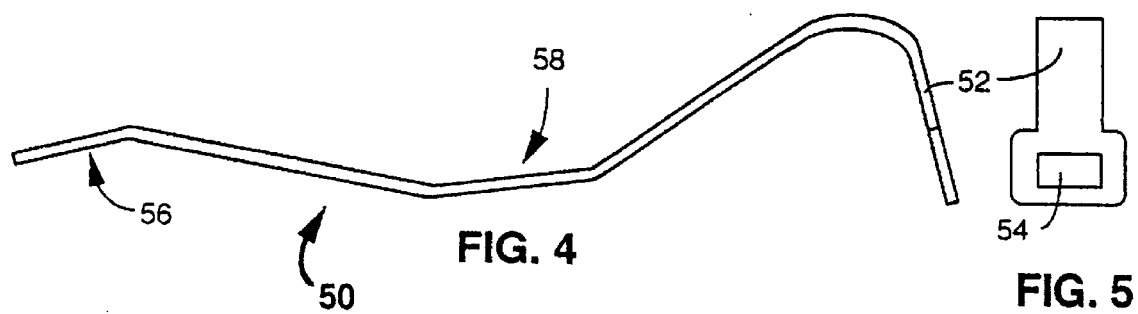
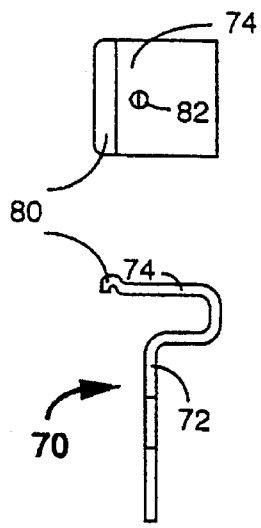
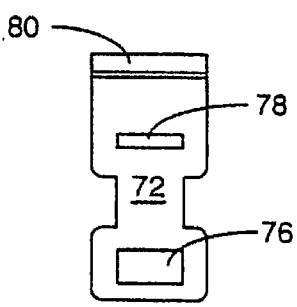
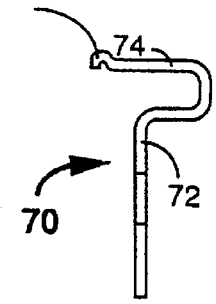

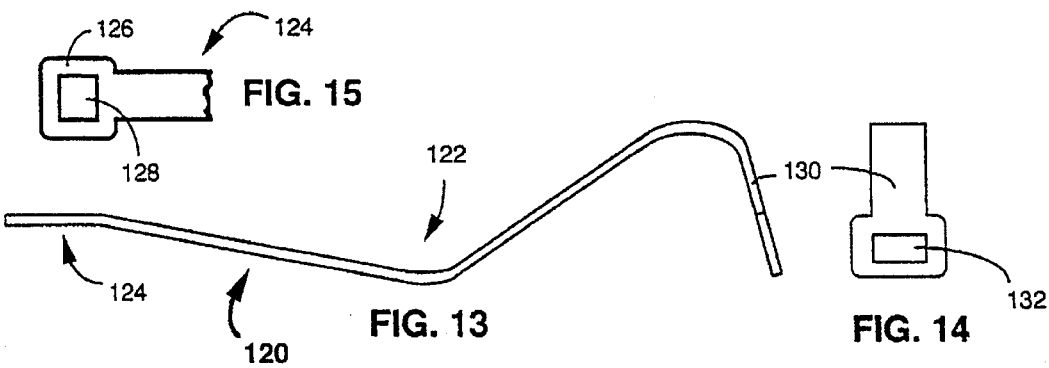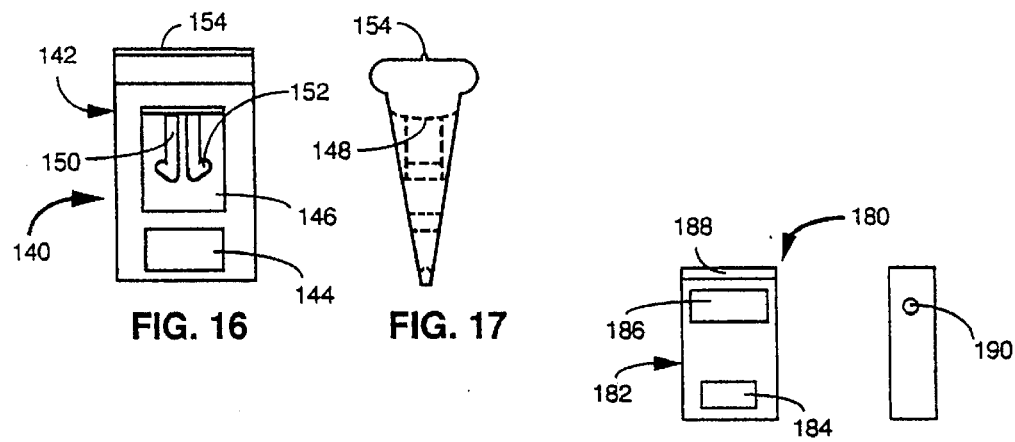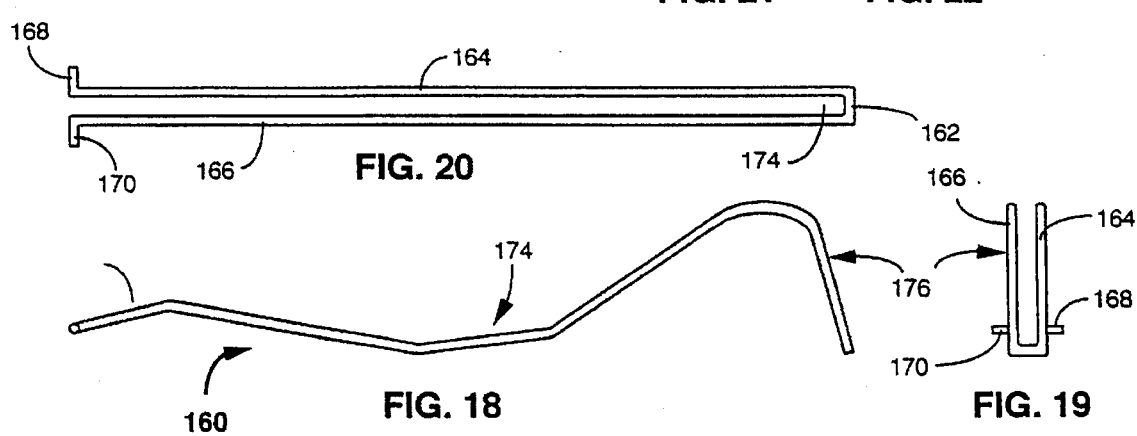

HEAT SINK AND RETAINER FOR ELECTRONIC INTEGRATED CIRCUITS

This is a continuation of application Ser. No. 08/441,274 filed on May 15, 1995, now U.S. Pat. No. 5,600,540.

FILED OF THE INVENTION

This invention relates to cooling of electronic assemblies.

Since the successful introduction of integrated circuits (ICs), there has been a steady progression toward larger IC devices to permit inclusion of a greater number of functions on the device. The result is that the heat produced by these larger semiconductor devices is not adequately removed by either natural air convection nor by powered ventilation, such as a fan.

Convection cooling is performed by use of a heat sink that is directly applied to the device. It is not desirable to use a bonding process, such as an adhesive, because of the permanent nature of such attachment; a chip may be discarded if malfunctioning and it is not desirable to throw away the heat sink too. It has therefore been found desirable to attach the heat sink to the chip by mechanical means such as a retainer clip. The typical heat sink currently in use comprises a flat plate, generally of the same size as the device, with a plurality of radiation fins extending upwardly. The heat sink is commonly fabricated from aluminum and is extruded and subsequently machined.

A parallel development in the electronic assembly art has been the provision of means for detachably securing large and generally expensive IC devices to a printed circuit board. The industry has developed sockets for this purpose. The socket is permanently attached to the board through soldering of a plurality of downwardly extending contact pins. The socket body includes an identical layout of holes into which the device may be inserted and then detachably locked into position. The socket may be constructed from metal, and is generally the same size as the device. It is highly desirable in electronic assemblies to achieve a commonality of parts from numerous suppliers so that the assembly company may select from multiple sources. This is achieved by establishing standards—a specification sanctioned by an industry group comprising suppliers and users. Sockets for semiconductor devices are typically standardized for various chips and/or chip families.

To facilitate the proper attachment of the heat sink to the device and socket assembly, the socket is provided with horizontally extending tabs or lugs from the side walls of the socket. These lugs cooperate with the heat sink retainer clip to detachably secure the heat sink to the device. All standardized sockets will have identical lugs in the identical position.

To illustrate the current industry use of the components of electronic assemblies described above, it is observed that one of the most popular microprocessor chips in use in the computer industry is the Intel family of microprocessors. These are generally large, high pin count, and relatively expensive components. They are typically mounted on a printed circuit board through a socket as described above. Currently, the Intel family of microprocessors include the 80486 ('486) and the Pentium microprocessors, which are available in various configurations, performance, and sizes. The industry has developed a family of sockets to cooperate with these microprocessors. One example, is the family of sockets in the ZIF series offered by AMP Incorporated, Harrisburg, Pa. AMP offers the Socket 3, Socket 4, and Socket 5 types of sockets for use with the above-described Intel microprocessors.

The present invention will be described in its preferred embodiment in connection with the above described microprocessors and sockets. First, however, the above-described microprocessor and socket will be described and then several prior art heat sink retainer clips will be described including the disadvantages of such prior art clips, by reference to several background and prior art figures.

BRIEF DESCRIPTION OF THE DRAWINGS OF THE BACKGROUND AND PRIOR ART

FIG. 1 is a three dimensional view of a portion of an electronic printed circuit board, a microprocessor device, and a heat sink.

PRIOR ART FIG. 2 shows three views of a first prior art heat sink retainer clip; and PRIOR ART FIG. 3 shows three views of a second prior art heat sink retainer clip.

BACKGROUND AND PRIOR ART

Referring to FIG. 1, there is shown a printed circuit board 2 which may be of standard construction well known in the art and including a plurality of through-holes 3 for solder mounting of the electronic devices, or sockets for supporting such devices for easier detachment from the printed circuit board.

A socket 4 is shown, similar to the Socket 5 AMP socket but excluding some of the details of that socket. The socket 4 has a plurality of pins 5 projecting downwardly for insertion into the holes 3, after which the pins are soldered to the board. The number and position of the pins may be identical to the pins (not shown) on the device. The socket body includes a plurality of holes 6 for receiving the pins on the device. The socket body is generally rectangular and has two opposed side walls, one of which is shown at 7. The side wall has a lug 8 that projects laterally out from the side wall.

A device 10, similar to the Intel Pentium microprocessor, is mounted on the socket 4 by insertion of a plurality of pins (not shown) into corresponding holes 6 in the socket. A locking assembly on the socket (not shown) secures the device to the socket for easy release through actuation of a locking lever.

A heat spreader to distribute the heat generated internal to the chip throughout the chip body, for more efficient dissipation of the heat and to prevent damage to any one spot within the chip is shown at 11. Not all chip packages include the heat spreader. The significance of the heat spreader, in relation to the invention, will be explained below.

A heat sink may be of various constructions, but all heat sinks are fabricated or formed from a material with high thermal conductivity, such as Aluminum. The heat sink 12 includes a plate 13 with a flat bottom surface. The plate is generally rectangular and its size is co-extensive with the size of the device 10. The sink 12 has a large number of fins 14 that are integral with the plate and formed from a single extrusion. In the central region of the sink, the fins are machined away to create a channel 15 that extends across the plate.

The heat sink is retained on the device by a resilient retainer clip that biases the sink into tight thermally conductive relation to the device. That is, the lower surface of the plate is forced against the upper surface of the device.

Examples of retainer clips are shown in FIGS. 2 and 3, labeled "PRIOR ART". Before referring to these clips, another clip and heat sink is shown in U.S. Pat. No. 5,208,731 in the prior art. As there disclosed, the assembly includes the heat sink configuration as described above, a flat plate from which a plurality of fins project upwardly. The retainer clip is of one piece fabricated through stamping from steel material that is flexible and resilient, such as properly heat treated 1075 steel of Rockwell C hardness. The clip cooperates with tabs or lugs on opposite side walls of the socket. Generally, the clip operates as a spring, and comprises a top member and two downwardly extending legs that detachably engage the lugs on the socket side walls. The distance between the legs, when the clip is in the relaxed condition, is less than the distance between the side walls and the clip must be flexed open, against the spring constant force of the material to be fitted over the side wall tabs. The top member is formed, so that in a side sectional view, there is a concave or bowed section in the center that bears against the heat sink forcing it into tight contact with the device. To assemble the clip on the heat sink assembly, the clip is aligned so that the top member straps fit into the spaces between the fins and is then pushed downward overcoming the spring constant force of the top member (while the legs are spread by the side wall lugs) until the legs, with openings at the lower ends for receiving the lugs, snap over the lugs and bias the heat sink downwardly into intimate engagement with the device top surface.

The prior art clips shown in FIGS. 2 and 3, are constructed and are assembled generally in the same way. The clip 20 in FIG. 2 is of one piece construction, also with downwardly extending legs 22, 24 from a single top member 26, having a central biasing portion 27, as compared to the above-described clip having several top member straps. The legs each have an opening, such as at 28, for engaging the lugs on the socket side walls. Clip 20 is designed similar to the above-described prior art clip so that the legs in the relaxed condition are separated by a distance D that is less than the distance between the sidewalls of the socket. The legs and top member flex when the clip is applied over the socket lugs. The legs then snap onto the lugs on the socket to hold the heat sink in place. Clip 20 also includes a tab on each leg, one of which is shown at 29. The tab functions to allow removal of the clip from the socket by permitting a screw driver or other small tool with a relatively sharp edge to be inserted between the leg and the tab while rotating the tool so as to spread the legs allowing the clip to be detached from the socket. The force with which the clip will bear against the heat sink after assembly depends on the height H measured from the lower surface of the central portion 27 of the top member 26 to the lower edge of the opening 28 which bears against the lower surface of the lugs on the socket sidewalls when the clip is attached.

The prior art clip 30, shown in FIG. 3, is again similar in many respects to the clip 20 and the above-described patented prior art clip. Clip 30, of one piece construction, includes top member 32 and two legs 34, 36 that snap fit over the lugs on the socket. It differs from clip 20 in that one end of the top member 32 extends beyond the leg 36 and is wider than the remaining portion of top member 32. This lever portion 38 is used to release the clip from the socket which has been assembled in the manner described above in reference to clip 20. The release is effected by pushing down with one finger in the area 40 illustrated by the force arrow, while simultaneously lifting the free end of the lever 38 with the thumb, the combined effect being to rotate the leg 36 outward (away from the socket wall and lug) while lifting the entire clip upward.

One disadvantage of the prior art devices shown in FIGS. 2 and 3 is that the legs of the retainer clips are spaced apart a distance that is smaller than the distance between the side walls of the socket. The purpose is to assure that the lower ends of the legs are biased inwardly to assist in retaining each side leg opening around the lugs on the socket side walls. If these legs were spaced too far apart, a sudden horizontal force on the assembly, producing acceleration of the relatively heavier heat sink (compared to the retainer clip) would result in one of the legs becoming disengaged from contact with its respective lug and the subsequent inadvertent disassembly of the heat sink from the socket. However, such design of the retainer clip so that there is a bias of the legs against the side walls of the socket has several distinct disadvantages.

First, ICs are made of different sizes, and the sockets are also of different sizes; the amount is generally small for the same family of ICs. An example is that the AMP sockets, generally known as the ZIF Socket 3, Socket 4, and Socket 5 family, for the Intel microprocessors known as the '486 and the pentium, have a difference in dimension between the side walls that varies by 0.1 inch. Although small, the prior art retainer clips, because of the precise relationship between the distance D between the legs and the distance between the side walls of the socket, cannot accommodate such variation in distance from one socket size to another in a family because the spring force changes considerably even with the small variation in distance and either grips the socket side walls too tightly or too loosely. Thus, the clips must be individually designed and tooled for each, even small, variation in size within a single chip/socket family. Furthermore, a computer assembly company must stock, for example, three different sizes of retainer clips to accommodate these variations. And in the assembly process, the assemblers must take great care to use the correct retainer clip size, which is not at all obvious due to the small difference in size, slowing production, and/or giving rise to quality problems.

Second, the distance D and the spring constant of the material are critical to effective operation of the retainer clips and therefore the manufacture of the clips must maintain high tolerance for acceptability. High tolerance stamping requirements for small metallic clips defeats the goal of low cost.

Third, the retainer clip, being a single piece, is constructed from a steel grade, and is heat treated, to produce a spring constant. This spring constant is the same through all regions of the stamped clip. The design of the retainer clip must therefore produce two biasing forces from the same spring constant—one between the legs bearing on the sidewalls of the socket and the other bearing against the top of the heat sink through flexing of the top member. That is, the shape, length, thickness and width of the top member must be chosen in accordance with the parameters of the spring constant of the material. These parameters of the clip must then be used to achieve the proper biasing of the legs against the side walls of the socket. Or vice-versa, i.e. the legs are "designed first" and then these parameters define the design constraints of the top member. In either event, there is an iterative process that the designer must go through. Such process includes building prototypes, and may even require building expensive stamping tooling before it can be ascertained that the design produces the downward bias on the heat sink in the desired amount while simultaneously producing the correct biasing force between the legs and the side walls of the socket.

Another disadvantage of the prior art devices is that the release of these clips are difficult in tight locations. The device, socket, and heat sink assembly is only one of many devices on a printed circuit board. Because it is desirable in all electronic equipment that the space be minimized, components are placed very closely on the board. It is easy to inadvertently damage a component or device during or after assembly, particularly in making service center or field repairs. It often occurs that the device must be removed as defective, or simply removed for later replacement in the assembly or repair operation. In confined spaces, a person's fingers may be too large to effect a quick and non-damaging release of the heat sink. Where fingers must be used, it is desirable to make the release operation simple and intuitive. Where a tool is used, it is desirable to use a tool with a blunt edge to prevent damage if the toll inadvertently slips off the clip and to locate the tool engagement area as far away from the other components and the circuit lines on the board as possible.

The retainer clip in prior art FIG. 2 must be released with a tool as described above. It is therefore subject to the disadvantages of tool release. The retainer clip in FIG. 3 may be released by the fingers as described above. However, the release operation requires the use of two fingers, one of which provides the downward release force as shown at 40 in FIG. 3 while the other lifts up on the end of the lever, making it difficult to perform in close conditions, such as when the printed circuit board has not been removed completely from the chassis. Furthermore, the height of all heat sink assemblies is limited by the desire to restrict the height of all printed circuit board assemblies so that they may be closely packed together in a chassis and thus minimize the size of the equipment. Accordingly, the leverage to rotate the leg 36 derives from the horizontal extension of the lever 38. Such extension, however, restricts the height of other components on the board adjacent the device. The leverage that may be desired to easily rotate the leg is thus compromised by the undesirability of further extension of the lever 38.

Release force is further complicated by the unitary, single piece construction of the prior art devices which have a single spring constant in all regions of the clip. It is desirable to have a high force holding the heat sink down, on the order of 10 or more pounds. This may be accomplished by using a strong spring constant. But that design aim is in direct opposition to easy rotation of leg 38 to effect release.

Another limitation of the construction shown in prior art FIG. 3 is the sharp radius of the stamped material at the free end of the lever 38 where the originally flat strap folds back upon itself. This requires that the material used be highly malleable and ductile to prevent weakening or even rupturing during the manufacture of the clip. Steel materials with a desirable resiliency, such as Stainless steel, however, are not highly malleable and cannot be easily used in a clip such as in FIG. 3.

Another problem with the prior art constructions is that certain types of devices, identical in all physical respects to other devices in the same family, require a heat spreader to redistribute heat from hot spots in a chip more evenly throughout the chip. A heat spreader may be a highly thermal conductive plate of metal that is secured onto the top of the device. While relatively thin, this spreader changes the effective height of the device-sink assembly. In the prior art clips, because the height H is fixed, it must be carefully controlled in manufacture increasing cost. Moreover, the effect of a height variation is to not only increase the force acting on the heat sink by the clip (which may then become too large) but also to increase the force necessary to release the clip. For the reasons mentioned above, this compounds the difficulty in achieving a fast and easy release.

Finally, there are other prior art heat sink retainer clips that interfere with the number and position of the fins on the heat sink. Still other clips may be assembled only with one orientation.

SUMMARY OF THE INVENTION

Accordingly, it is an object of this invention to overcome the disadvantages of these prior art heat sink assemblies.

It is a further object to provide a heat sink assembly that includes a two-piece retainer clip. This construction, if not counter-intuitive, at least violates the general rule of fabricated mechanical design assemblies that minimum cost follows the least number of parts. Moreover, the two piece design of the present invention permits an easier rotational movement to effect the engagement or release of the retainer clip onto the socket side wall lugs.

Another object is to provide a heat sink assembly that will accommodate variations in the size of the sockets bearing the lugs engaged by the retainer clip without materially increasing the release force required for disassembly of the heat sink from the socket and device.

Still another object of the present invention is to provide a retainer clip for a heat sink assembly that may be fabricated from Stainless steel because extremely small bend radii are not required; a Stainless steel retainer clip is less susceptible to environmental damage, such as corrosion.

An important object is to also permit the manufacture of a retainer clip for a heat sink assembly that has relatively relaxed tolerances compared to the prior art clips thereby reducing manufacturing cost.

Another important object is to reduce the force required to attach and detach the retainer clip from the socket making it less likely that there will be inadvertent damage to other components on the board.

And yet another advantage of the present invention is to provide a tool engagement area conveniently located on the retainer clip that allows the clip to be easily released although the tool is not near other components on the printed circuit board and therefore is not likely to cause any damage even if the tool slips off the engagement spot. The clip also has provisions for minimizing slipping of an assembler's finger or the tool off the clip during attachment or detachment.

The present invention is a heat sink assembly that includes a mechanical retainer clip to detachably and releasably secure a heat sink to an electronic semiconductor or integrated circuit device or component to permit effective cooling of the device. A retainer clip includes two parts, at least one of the parts formed from a suitable resilient metal, one part attaches to a socket on which the device is mounted by means of engagement of an opening in a leg of this part with a lug on the side wall of the socket and which extends across the top of the heat sink to the opposite side wall of the socket, this part, after assembly, producing a downward force on the heat sink, and the second part loosely attached to the free end of the first part and also includes an opening that after assembly engages a lug on the other side of the socket, the second part being easily rotatable by an assembler or technician to facilitate release and attachment.

Several embodiments of a heat sink assembly constructed in accordance with the present invention are described below, including a preferred embodiment, all of which are shown in the following drawings.

BRIEF DESCRIPTION OF THE DRAWINGS OF THE INVENTION

FIG. 4 a side elevation view of a first member of the retainer clip of the present invention;

FIG. 5 is an end elevation view of the first member;

FIG. 6 is a partial top view of the first member;

FIG. 7 is a side elevation view of a second member of the present invention;

FIG. 8 is an end elevation view of the second member;

FIG. 9 is top view of the second member;

FIG. 13 is a side elevation view of the first member of the first alternative embodiment;

FIG. 14 is an end elevation view of the first member of the first alternative embodiment;

FIG. 15 is a partial top view of the first member of the first alternative embodiment;

FIG. 16 is a front elevation view of the second member of the first alternative embodiment;

FIG. 17 is a side elevation view of the second member of the first alternative embodiment;

FIG. 18 is a side elevation view of the first member of the second alternative embodiment;

FIG. 19 is an end elevation view of the first member of the second alternative embodiment;

FIG. 20 is a partial top view of the first member of the second alternative embodiment;

FIG. 21 is an front elevation view of the second member of the second alternative embodiment; and FIG. 22 is a side elevation view of the second member of the second alternative embodiment.

DETAILED DESCRIPTION OF THE PREFERRED EMBODIMENT OF THE INVENTION

Figure 1:
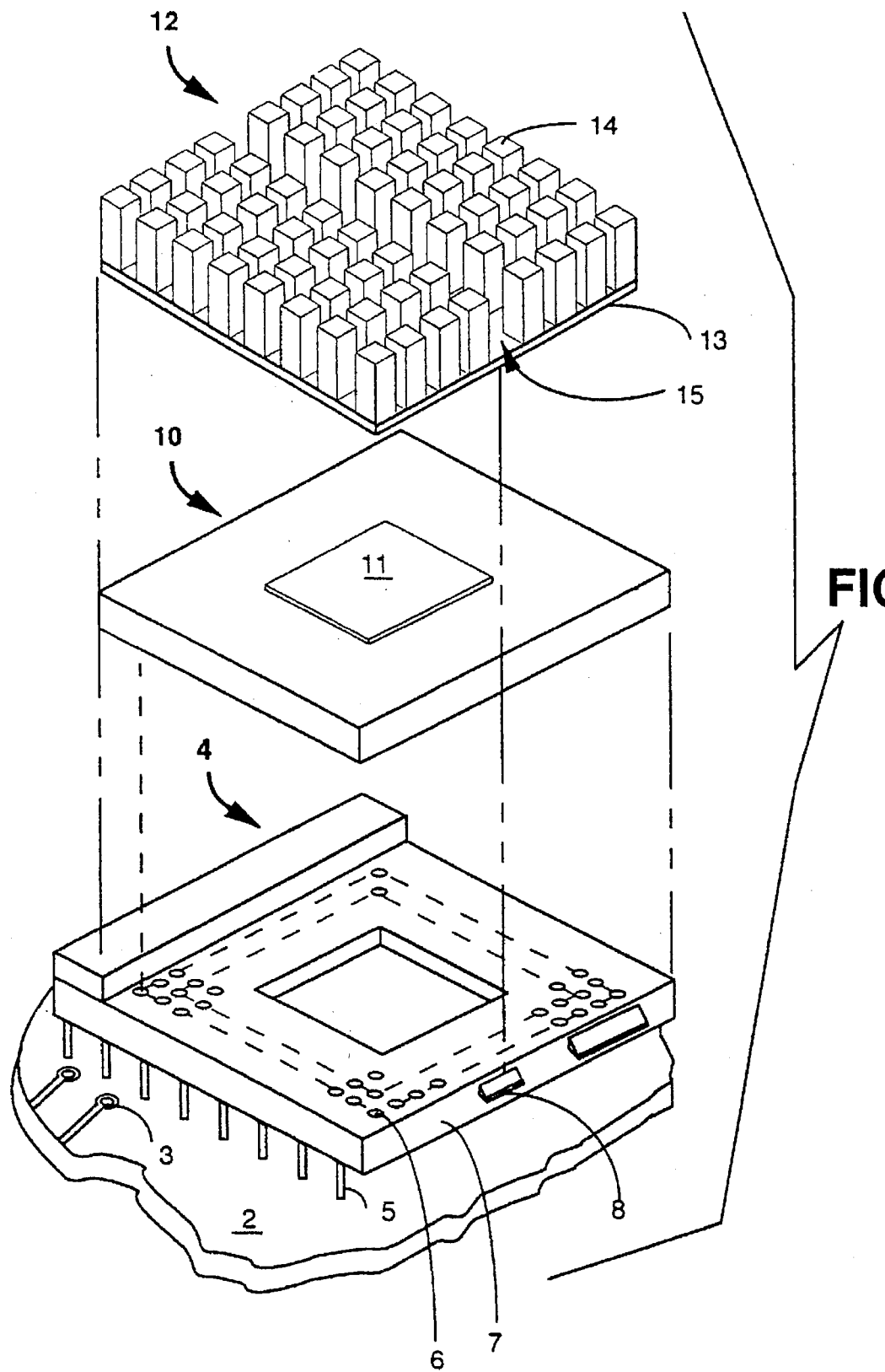
Figure 2:
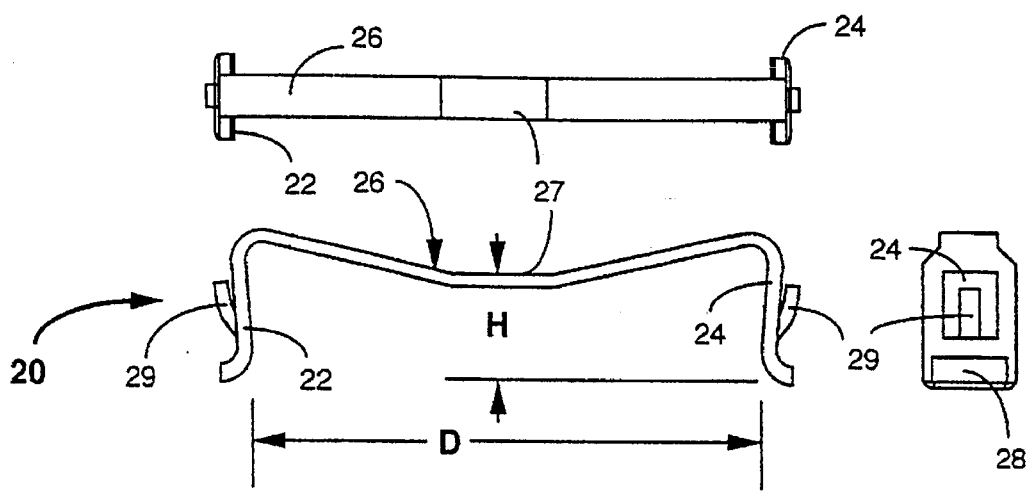
Figure 3:
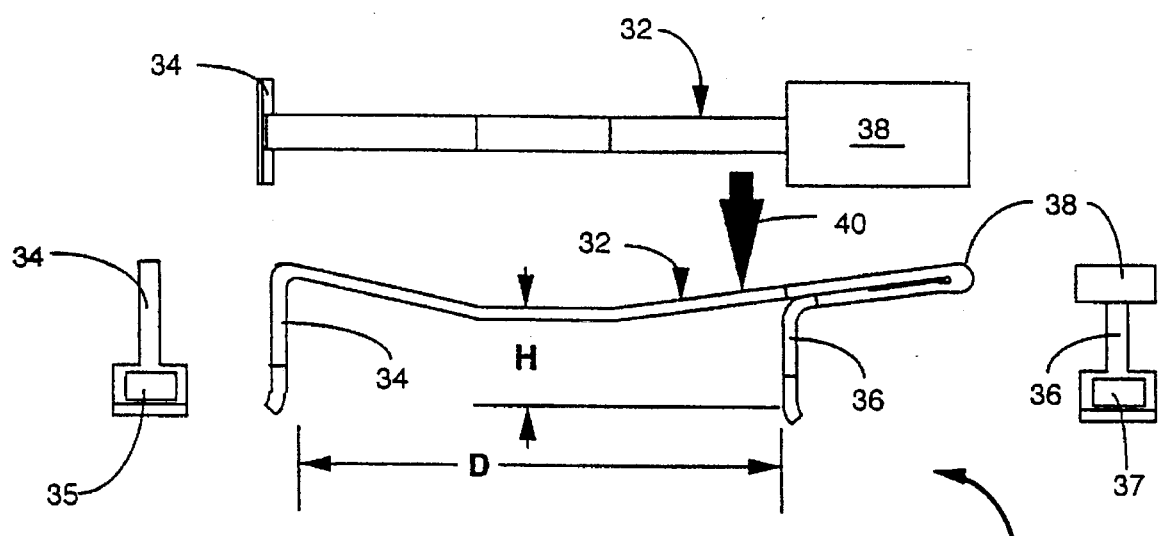

Referring now to FIGS. 4 through 6, there is shown one of two members that comprise the preferred embodiment of the present invention. This first member, 50, is formed from a single piece of resilient metal, such as Stainless steel, and may be stamped from sheet material in a manner well known in the art. The member 50 may then be bent into the generally "L" shaped configuration shown in FIG. 4 having a longer portion and a shorter portion. The shorter portion forms a leg or retaining section 52 having an opening 54 adjacent one end thereof. The opening 54 is designed to receive one of the lugs 8, 9 on the side wall of the socket 4 as will later be described. The member 50 also has a free end section 56 and a central section 58 that provides the biasing force between the heat sink and the device after assembly. As seen in FIG. 4, the central section 58 is formed by the concave shape of the first member 50.

Referring to FIG. 6, the free end section 56 is bifurcated to form two arms 60 and 62. Each arm is identical to the other. The tip of the free end 56 is beveled as shown at 64 to facilitate the assembly of the first member with the second member described below. Adjacent the tip of the free end 56, on each arm, there are notches 66, 68.

Referring to FIGS. 7 through 9, there is shown the second member 70 of the preferred embodiment of the invention. The member 70 is stamped from similar material as the first member although other material may be used. The second member 70 is bent into a "?" shape when viewed from one side. Member 70 has a body portion 72 and a top portion 74. Body 72 has two openings, 76 for receiving a lug, such as lug 9, and 78 for receiving the free end section 56 of the first member 50. The top portion 74 has a transverse ridge 80 and an aperture 82. The ridge is provided to stabilize a finger on the top portion 74, i.e. to prevent the finger from sliding off the top portion when applying pressure to the second member 70. The aperture 82 also assists in stabilizing a finger on the top portion 74 but serves the additional function of stabilizing the tip of a tool or other bluntly pointed object, such as the tip of a ball point pen, from slipping off of member 70 when pressure is applied. It will be understood that the aperture 82 could be an indentation, dimple, ridge or other surface irregularity that prevents slipping and the ridge could also be some other minor surface shape or configuration that provides the stabilizing function.

Figure 10:
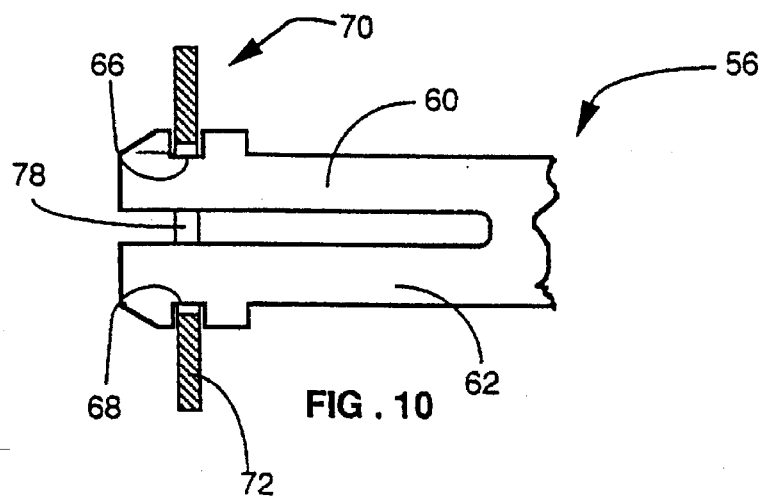
FIG. 10 is a partial and sectional view of the assembly of the first and second members of the preferred embodiment.

Referring to FIG. 10, the retainer clip is assembled by inserting the two arms of the free end section 56 of the first member 50 into the opening in body 72 of second member 70. The two arms may be momentarily squeezed together so that the arms may be forced into the opening 78 of member 70 that has a lateral dimension that is slightly smaller than the lateral width of the ends of arms 60, 62, but is slightly larger than the lateral distance between the lands of the two notches 66, 68.

Furthermore, the height of opening 78 is slightly greater than the thickness of the end 56. The result is that the member 70 is loosely supported by the free end 56 of the first member 50. This loose fit allows the member 70 to be rotated or pivoted in the vertical plane. This freedom of movement enables the person assembling the two members to manipulate the hole 76 over the lug, such as 9, with considerable ease.

Figure 11:
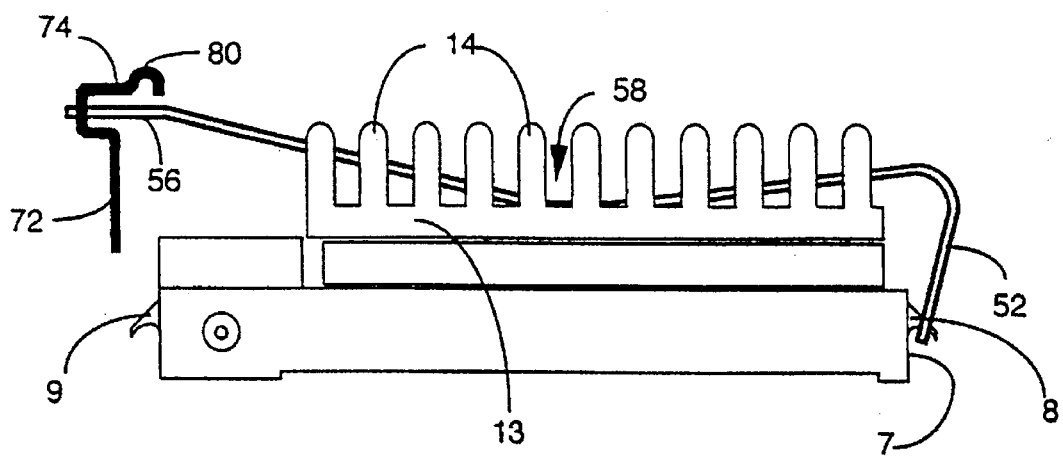
FIG. 11 is a side elevation view of a socket, device and heat sink, showing the preferred embodiment of the present invention partially assembled.
Figure 12:
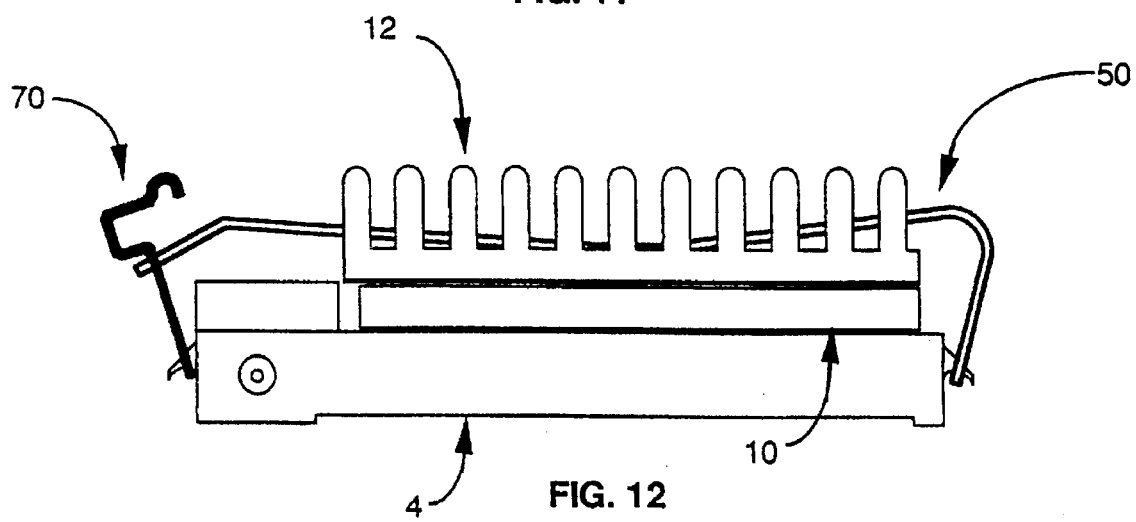
FIG. 12 is a side elevation as in FIG. 11 showing the assembly completed.

The assembly is best understood by reference to FIGS. 11 and 12. FIG. 11 shows the device 10 mounted and in position on socket 4 and heat sink 12 is positioned, but is as yet unsecured, on device 10 so that the lower or bottom surface of sink 12 is in contact and engagement with device 10. The assembled retainer clip is positioned above the heat sink and the biasing section of member 50 is aligned with the channel 15 (as seen in FIG. 1) in the heat sink 12. The leg or retainer section of the first member 50 is positioned so that the opening 54 may be drawn over the lug 8. The central section of the first member 50 is in contact with the upper surface of the plate of the heat sink 12. In this relaxed position, as a result of the manner in which the member 50 was bent, the free end section 56 of the member 50 is above the plate of the heat sink 12. To secure the retainer clip, the assembler engages his or her finger on the top portion 74 of the member 50 and presses downward to overcome the resiliency or biasing force of the member 50. When the opening 76 is laterally adjacent the lug 9 on the opposite side wall of the socket 4, the assembler then rotates the member 50 by applying more pressure on the outer edge of the top portion 74 causing the opening 76 to be positioned over lug 9. A release of pressure of the assembler's finger while the rotated position of the member 70 is maintained will cause the opening to catch on the lug 9. The rotatable joint between the members 50 and 70 will be understood to be a principal advantage of the present invention. It allows easy rotation of the member 70 relative to the member 50 even where there are height differences due to, for example, the inclusion of the spreader on some devices, and length variations of the socket as described above. Because the present invention is two-piece, allowing the member 70 to be rotated freely rather than by overcoming the spring constant in the prior art one-piece designs, height and length variations are accommodated without resulting in increasing the attachment or release forces.

It must be understood that the assembly operation may be taking place in a very confined space and that movement of the assembler's finger may be constrained. This is particularly true if the assembly is performed after other electronic components are attached to the printed circuit board and the board may even be within an enclosure. During post-assembly operations, it may become necessary to replace a malfunctioning device, this will require disassembly or detachment from the socket. It is more likely in this disassembly operation that the circuit board will be in tight confines within the electronic enclosure, such as the housing of a computer. The retainer clip of the invention is thus provided with the aperture 80 that allows the disassembler to effect detachment of the retainer clip by simply pressing the point of a tool on the aperture to produce a slight downward movement of the lower end of the body 72 to free the opening 76 from the lug 9.

After assembly of the retainer clip on the socket 4, the heat sink 12 is normally held in place by the biasing force of the clip. In the preferred embodiment this force may be on the order of 10–14 pounds. This same biasing force produces the contact that provides a highly thermal conductive path for the heat from the device 10. In the event of a sharp blow to the assembly, generally in the plane of the device, the frictional engagement between the heat sink lower surface and the upper surface of the device could allow the heat sink to slide off the device. However, the sink is constrained from movement relative to the retainer clip in one direction because the member 50 is in the channel of the heat sink and in the other direction because the edge of the heat sink plate will strike and be restrained by the leg 52. The heat sink may also be provided with a lip along each of the edges that overhangs the edges of the device to prevent movement in that direction.

It will also be appreciated that the retainer clip may be mounted in either direction which simplifies high speed production assembly. It may also be noted that the outer edge of the top portion 74 of member 70 projects laterally outward from the socket/device/heat sink assembly only a minor amount thereby allowing devices to be secured to the printed circuit board relatively close to the assembly. This allows for a more compact design and also assists in preventing inadvertent damage of adjacent devices when the heat sink is being secured to the device by the retainer clip. Moreover, it will be seen that there is a relatively low profile for the retainer clip so that no portion of the clip after assembly protrudes above the top plane of the heat sink.

DETAILED DESCRIPTION OF THE TWO ALTERNATIVE EMBODIMENTS

Referring to FIGS. 13 through 17, there is shown a first alternative embodiment of the present invention, also comprising two pieces, that are loosely joined when in use. FIG. 13 shows a first member 120 comprising biasing and retaining section. The biasing and retaining member includes the central concave or "V" shaped region 122 and a free end section 124 having an enlarged section 126 integrally formed therewith from a strap of suitable spring steel bent into the shape shown. The enlarged portion 126 has an opening 128. The opposite end of member 120 includes a leg or retainer section 130 with an opening 132 for receiving a lug, such as lug 8.

As seen in FIGS. 16 and 17, a second or retainer member 140 is formed of plastic by injection molding or other suitable process. Member 140 includes a body 142, having two openings 144 and 146.

The opening 144 is for receiving a lug, such as lug 9, when the clip has been assembled with the socket/device/heat-sink. Opening 146 receives the enlarged free end of the first member 120. The upper wall of the opening 146 has a curved shape 148 as seen best in FIG. 17. Depending from the curved wall 148 are two tangs 150 integrally formed with the body 142. Each tang 150 has a barb 152 directed toward the side walls of the body. The top wall of the body 142 has a ridge 154 for assisting an assembler to apply pressure to the member 140 without the finger slipping off the top of the body.

The first alternative embodiment is assembled by inserting the free end section 124 of the member 120 into the opening 146 below the tangs 150 and then when the hole 128 is aligned with the tangs, moving the free end section 124 upward. This latter movement, since the lateral distance between the two outwardly facing barbs 152 is greater than the width of the hole 128, will cause a momentary inward deflection of the tangs until the barbs pass the bottom surface of the end 124 resulting in a snap fit that connects the two members together. It will be noticed that the upper surface of the end 124 supports the second member 140 on the curved wall 148 allowing the member 140 to rock, or pivot, or rotate relative to the first member 120. This action facilitates the "catching" of the lug receiving opening 144 on the lug as the retainer is being secured onto the heat sink.

Referring now to FIGS. 18 through 22, there is shown a second alternative embodiment of a spring retaining clip for securing and restraining a heat sink on a semiconductor device that is mounted in a socket. This second alternative has two members 160 and 180. The member 160 is formed from a spring steel wire that is first bent into an elongated "U" shape comprising a short base portion 162, two legs 164,166 and two ears at the free ends of the legs 168, 170. The base portion 162 and the immediately adjacent leg portions form an opening 174 for receiving a lug, such as lug 8. Member 160 also has a biasing section 174 similar to the preferred embodiment and includes a hook or retaining section 176.

The second member of the second alternative embodiment is shown in FIGS. 21 and 22. Second member 180 may be formed of plastic or may be shaped from sheet metal or could be cast. It includes a body 182 having two openings 184, 186. Opening 184 in the lower portion of the body is for receiving a lug, such as lug 9 on the socket, when the retainer clip is assembled to the socket/device/heat-sink. A top wall 188 provides a surface against which an assembler's finger can apply pressure during assembly and may be provided with an aperture or other indentation or protrusion as previously described in reference to the preferred and first alternative embodiments. The body has two holes 190 in the side walls adjacent the opening 186.

The second alternative embodiment is assembled by inserting the two ears 168,170 into the opening 186 by depressing the two legs 164 and 166 together and aligning the ends of the ears with the holes 190. The ears will spring into the holes so that the member 180 is supported for pivotal movement on the first member 160.

From the above description of the three embodiments it will be seen that the objects of the invention have been attained. However, it should be understood that various changes may be made in the configuration, material, shape and other details of these embodiments without departing from the scope of the invention. These changes may be required to accommodate similar sockets or devices that differ in details only. Thus the scope of the invention should be determined from the following claims and the equivalents of elements and means contained in such claims

I claim:

1. A heat sink assembly including a heat sink and a spring retainer clip for providing cooling to an electronic integrated circuit device, the device being mounted on a socket having at least two opposed side walls, each wall having a lug projecting laterally outward from the wall;

said heat sink comprising a metallic plate with a plurality of fins projecting upwardly from the top surface of the plate defining a series of channels; and said spring retainer clip comprising two members:

the first member comprising a single spring metal strap received in one of said channels, said strap bent near one end so as to form a generally "L" shaped configuration having a longer portion and a shorter portion, the longer portion including a section for biasing the heat sink against the device and a free end section, and the shorter portion having an opening adjacent one end for receiving one of the lugs on the socket sidewall; and the second member rotatably supported by said free end section of the longer portion of the first member and including an opening for receiving the other lug on the opposite side wall of the socket.

2. The assembly of claim 1 wherein said second member is formed into a generally ?-shape body with a top portion and a leg portion, said second member opening being located in the leg portion of said ?-shape.

3. The assembly of claim 2 wherein the top portion of said ?-shape body includes means for stabilizing the engagement of a tool used to effect release of the retainer clip second member from the socket lug to thereby detach the heat sink assembly from the device.

4. The assembly of claim 3 wherein said stabilizing means of said second member includes a transverse ridge for stabilizing engagement of a finger used to engage or release the retainer clip from the socket lug to thereby attach or detach the heat sink assembly to or from the device.

5. The assembly of claim 1 wherein said free end section of said longer portion of said first member is longitudinally bifurcated so as to form two arms, each arm having an opening adjacent the free end, said second member having at least one opening, at least one of said openings in said second member receiving said at least one opening in said arms so as to loosely support said second member.

6. In a heat sink assembly providing cooling to an electronic integrated circuit device wherein the device is mounted on a socket, the socket body of generally rectangular shape having at least two opposed side walls, each wall having a lug projecting laterally outward from the wall, the device having a relatively flat rectangular upper surface, and a heat sink formed from a highly heat conductive material, the sink having a generally flat bottom surface in heat conducting engagement with the device upper surface and a plurality of fins on the upper surface defining at least one channel, the improvement comprising:

a single concave elongated means extending across the heat sink and received in one of said channels, said means biasing the heat sink bottom surface into heat conducting engagement with the device upper surface said biasing means having a free-end section longitudinally bifurcated so as to form two arms;

first means connected to said biasing means releasably attaching said biasing means to one lug on the socket at one end; and second means loosely supported by said two arms of the bifurcated section of said biasing means for releasably attaching said biasing means to the other lug on the socket so that said biasing means is releasably attached to said socket to force said heat sink bottom surface into heat conductive engagement with the upper surface of the device.

7. The improvement of claim 6 wherein said biasing means and said first means an integral metal spring strap.

8. The improvement of claim 7 wherein said biasing means comprises a concave portion bearing directly on an upper surface of the heat sink.

9. In combination, a heat sink and a heat sink retainer clip for use in conjunction with an electronic device, such as a semiconductor, to provide cooling of the device, the device being mounted on a rectangular socket with opposing sidewalls, at least two opposed side walls having lugs projecting laterally outward from the walls, the heat sink comprising a flat plate with a plurality of fins projecting upwardly from the top surface of the plate, a central channel of the plate being free of the fins to receive the clip, the retainer clip comprising:

a first member including a retaining section and a biasing section:

said biasing section received in said central channel of the plate and extending substantially across the plate for biasing the heat sink against the device;

said retaining section having an opening for receiving the lug on the socket side wall and connected to said biasing section adjacent one end thereof;

said biasing section bifurcated at the end opposite to the retaining section to form two freely extending arms; and a second member including an opening for receiving the lug on the opposite side wall of the socket, at least one of said second member and said freely extending arms defining an opening for receiving the other of said second member and said freely extending arms so that said second member is rotatably supported on the freely extending arms.

10. The combination of claim 9 wherein said first member comprises a stamped single piece of rectangular cross section resilient material.

11. A heat sink assembly including a heat sink and a spring retainer clip for providing cooling to an electronic integrated circuit device, the device being mounted on a socket having at least two opposed side walls, each wall having a lug projecting laterally outward from the wall;

said heat sink comprising a metallic plate; and said spring retainer clip comprising two members:

the first member comprising a single spring metal strap bent near one end so as to form a generally "L" shaped configuration, the longer leg of the "L" including a section for biasing the heat sink against the socket, and the shorter leg of the "L" having an opening adjacent one end for receiving one of the lugs on the socket sidewall; the second member having at least one opening for receiving the other lug on the opposite side wall of the socket; and means for loosely and rotatably supporting said second member from the free end of the longer leg of said first member.

12. In a heat sink assembly providing cooling to an electronic integrated circuit device wherein the device is mounted on a socket, the socket body of generally rectangular shape having at least two opposed side walls, each wall having a lug projecting laterally outward from the wall, the device having a relatively flat rectangular upper surface, and a heat sink formed from a highly heat conductive material, the sink having a generally flat bottom surface in heat conducting engagement with the device's upper surface, the improvement comprising a spring retainer clip having:

a first member with a retainer section, a biasing section, and a free end section, said retainer section having an opening receiving a lug on the socket side wall, said biasing section engaging said heat sink and biasing said heat sink against the device, said free end section bifurcated to form two arms, each arm having a notch; and a second member having at least one opening engaging at least one of said notches to loosely support said second member from said first member, said second member including means for releasably attaching said second member to the other lug on the socket so that the retainer clip forces said heat sink bottom surface into heat conductive engagement with the upper surface of the device and retains the heat sink in place.

* * * * *